United States Patent
Wand et al.

(10) Patent No.: US 8,176,368 B2
(45) Date of Patent: May 8, 2012

(54) ERROR CORRECTING DPCM TRANSCODING

(75) Inventors: Martin Austin Wand, Plano, TX (US); Jesse Gregory Villarreal, Jr., Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 277 days.

(21) Appl. No.: 12/685,017

(22) Filed: Jan. 11, 2010

(65) Prior Publication Data
US 2010/0180166 A1 Jul. 15, 2010

Related U.S. Application Data

(60) Provisional application No. 61/143,958, filed on Jan. 12, 2009.

(51) Int. Cl.
*G06F 11/00* (2006.01)
(52) U.S. Cl. ...................................................... 714/704
(58) Field of Classification Search .................. None
See application file for complete search history.

(56) References Cited

U.S. PATENT DOCUMENTS 6,529,633 B1 * 3/2003 Easwar et al. ................ 382/239

* cited by examiner

*Primary Examiner* — Guerrier Merant
(74) *Attorney, Agent, or Firm* — Alan A. R. Cooper; Wade James Brady, III; Frederick J. Telecky, Jr.

(57) ABSTRACT

A digital system is provided that converts compressed data using an indexed transcoding lookup table. A stream of compressed data samples has data samples that represent one of n values corresponding to the first compression format. The transcoding table has at least n indexed entries, and each of the n indexed entries contains a data value corresponding to a second compression format. The transcoding table is accessed by using each of a portion of the received data samples as an index into the table to form a set of transcoded data samples that have a second compression format. The set of transcoded data samples form a stream of compressed data samples that have the second compression format. The transcoding table may be augmented to perform transcoding error correction by concatenating an error value with the data sample to index the table.

14 Claims, 4 Drawing Sheets

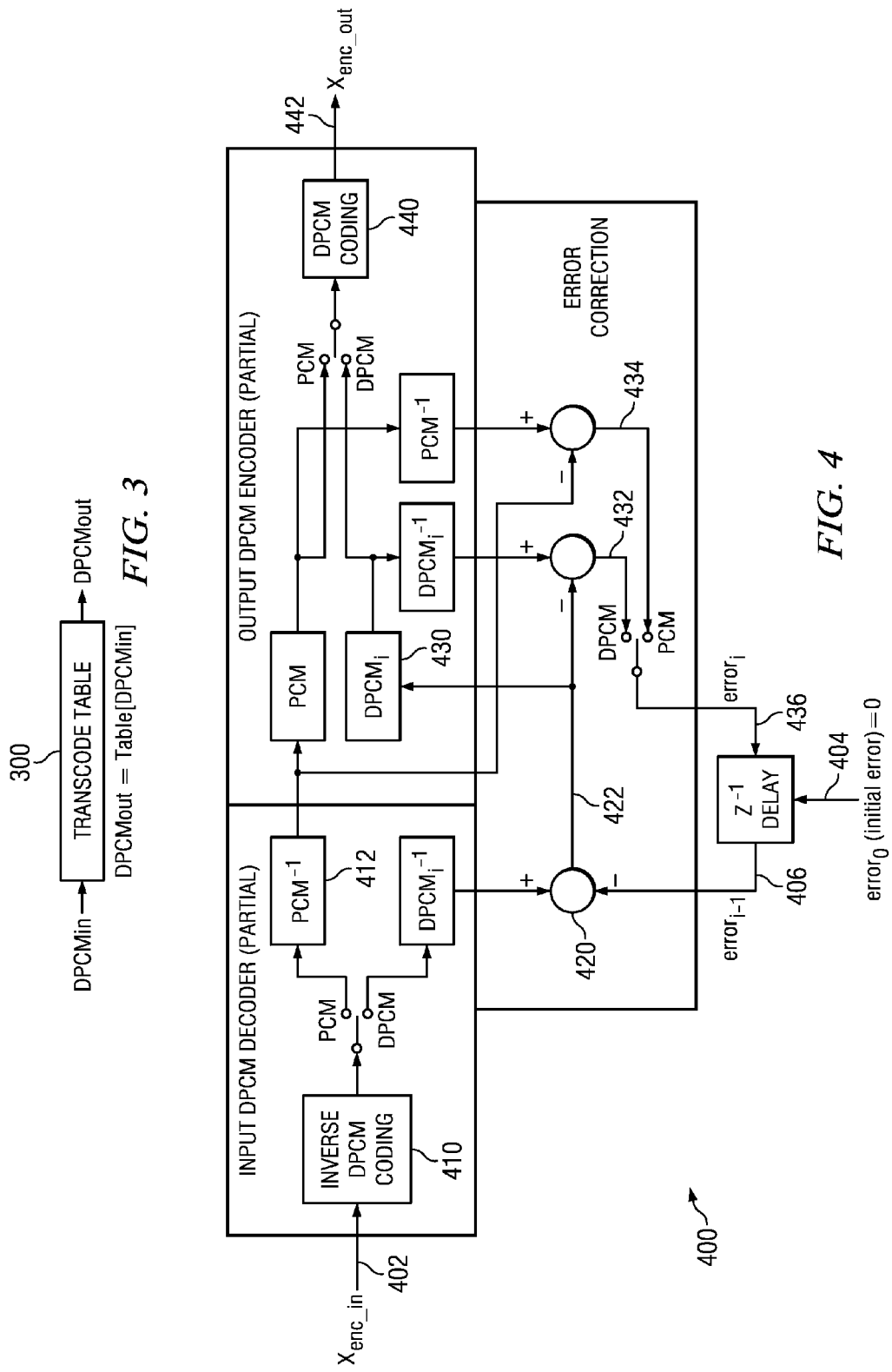

$[error_i, X_{enc\_out}] = table[error_{i-1}, X_{enc\_in}]$

ERROR CORRECTING DPCM TRANSCODING

CLAIM OF PRIORITY UNDER 35 U.S.C. 119

The present application claims priority to and incorporates by reference U.S. provisional application No. 61/143,958, filed Jan. 12, 2009, entitled "Error Correcting Fast DPCM Transcoding."

FIELD OF THE INVENTION

The present invention relates to the conversion of compressed data from one format to another format, and in particular to the conversion of DPCM compressed data.

BACKGROUND OF THE INVENTION

Differential pulse code modulation (DPCM) compression is a well known method of reducing the number of bits that must be transmitted or the amount of data that must be stored to represent a sequence of data values. DPCM compression is applicable anywhere that a data stream is generated including, but not limited to, audio and image data. It utilizes a procedure by which a prediction of the value is determined based on a repeatable algorithm utilizing prior data values. When the actual data value is received, it is compared to the predicted value. The difference, which ideally is very small, is then stored instead of the actual value. In addition to the difference, some bits must be stored to represent how this difference must be interpreted during the decompression process. DPCM compression and decompression is not loss-less but the data loss is small, depending on how accurate the predicted value for each data element is. For example, if the predicted value exactly matches the actual value for all data elements (which is very rare), then all that must be stored is the fact that there is no difference between the actual and predicted values. No error is introduced when this is the case and the amount of data stored per data element can be quite small. As the difference value increases due to less accurate predicated values, when the difference can not be represented in the allotted number of bits then the difference must be scaled to fit. This means that some of the lower bits of the difference are lost. This results in an error between the original data value and the value generated by the DPCM decompression, but since the DPCM algorithm utilizes the original actual data value in the encoding process for each data value, the error is not cumulative.

In traditional DPCM algorithms, the number of coded bits per data element is predetermined and constant. There are also algorithms that code to an adaptable number of bits.

BRIEF DESCRIPTION OF THE DRAWINGS

Particular embodiments in accordance with the invention will now be described, by way of example only, and with reference to the accompanying drawings:

FIG. 3 is a block diagram illustrating transcoding via a lookup table;
FIG. 4 is a block diagram illustrating error correction.

DETAILED DESCRIPTION OF EMBODIMENTS OF THE INVENTION

DPCM compression may be used to make a system more efficient, either in data transmission or data storage. When DPCM compressed data is received, it is typically decompressed before being processed or used. Ideally this should be done in hardware to avoid adversely affecting performance, but that requires that DPCM decompression hardware matches the DPCM compression. If these do not match, then either the DPCM compressed data must be decompressed in software or it must be transcoded into the DPCM compressed format that the hardware understands. An embodiment of the present invention provides a method of transcoding DPCM compressed data from one DPCM format to another by using a lookup table that is indexed using data samples that are compressed in one format to produce data samples that are compressed in a different format. In this manner, transcoding is performed in a very quick fashion, with a relatively minor impact on the data quality.

Since DPCM compression anchors each compressed data value to the original data value, when the DPCM compressed data stream is decompressed then recompressed into the new DPCM format, there is no cumulative error when the new DPCM data stream is decompressed. The fast and simple method of transcoding DPCM compressed data from one DPCM format to another DPCM format using a lookup table without going through a complete decompression and recompression may introduce cumulative error in the data stream when the output DPCM format is decompressed. For specific applications where this cumulative error is unacceptable, another embodiment of the invention provides error correction during the transcoding process. The resulting data stream after transcoding and decompression demonstrates no cumulative error and only minor single data value errors.

Several terms that will be used within this document are defined in Table 1.

TABLE 1

Definition of Terms

| | |
|---|---|
| Xorig(n) | original current data value |
| Xpred(n) | predication of current data value |
| Xdiff(n) | Xpred(n) − Xorig(n) |
| Xenc(n) | encoded representation of current data value |
| Xdec(n) | decoded representation of current data value |

Figure 1:
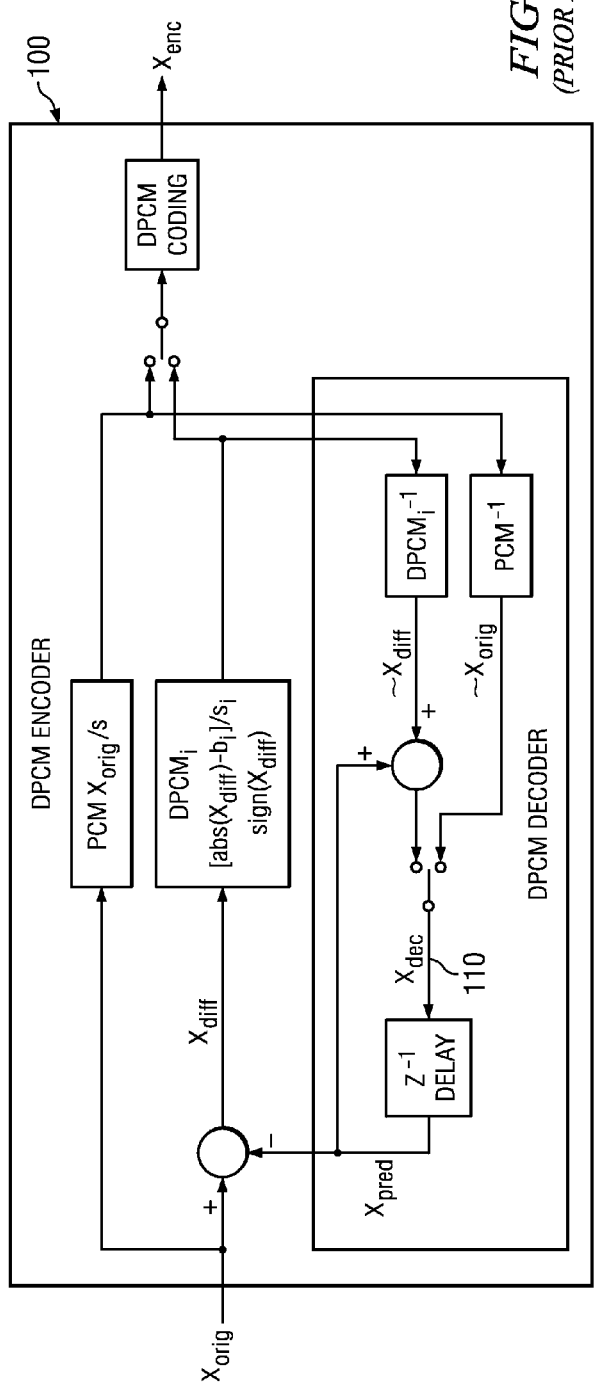
FIG. 1 is a block diagram of a prior art DPCM encoder.

FIG. 1 is a block diagram of a prior art DPCM encoder 100. A typical DPCM compression process will now be described in general in order to better understand the current invention. Since DPCM compression/decompression is well known, the process does not need to be described in detail herein. The first data value can not be predicted. It is therefore Xorig(0)/a(0). a(0) provides the scaling from the original number of bits to the compressed number of bits. For example, if the original data is 12 bits and the compressed data is 8 bits, then a(0) will be 16.

In many applications, DPCM compression utilizes a simple predictor which is merely the previous data value, Xpred(n)=Xdec(n−1). If a more advanced predictor is used, transcoding from one DPCM format to another may generate less acceptable results because the predicted value may be inaccurate. Successive data values can be compressed by computing abs(Xdiff(n)) and then determining which DPCM mode will be used based on abs(Xdiff(n)), as indicated in Table 2. The first one that is successful defines the DPCM mode. If abs(Xdiff(n)) is greater than or equal to b(m), then that data value is PCM compressed as described later.

TABLE 2

DPCM modes

| | |
|---|---|
| DPCM1 | if abs(Xdiff(n)) < b(1) |
| DPCM2 | if abs(Xdiff(n)) < b(2) |
| ... | ... |
| DPCMm | if abs(Xdiff(n)) < b(m), where b( ) contains monotonically increasing values representing the breakpoints between the DPCM modes. |

Each DPCM mode defines a coding format of "ccsxxxxx" as shown in Table 3. A DPCM value is computed for the current data value using the format described in Table 3.

TABLE 3

DPCM format

| | |
|---|---|
| c | a unique pattern of bits (shown as two bits above but can be any number) that indicates the DPCM mode |
| s | a single bit representing the sign(Xdiff(n)) |
| x | is bits (shown as 5 bits above but can be any number) that indicates a value that is a function of abs(Xdiff(n)) |
| DPCM10-6 | DPCM compression with 10 bits of uncompressed input data, 6 bits of output data, i.e. the total number of "c" plus "s" plus "x" bits is 6 |
| DPCM6-10 | DPCM decompression with 6 bits of compressed input data and 10 bits of uncompressed output data |

For each DPCM mode in a particular DPCM algorithm the total number of bits is constant. Table 3 illustrates an eight bit code, but other embodiments may use other values for c, s and x. The number of "c" bits and "x" bits is not constant and can be different for each DPCM mode. The "x" bits for DPCM mode "i" are typically (abs(Xdiff(n))−b(i))/s(i), where s(i) is a scale factor for DPCM mode "i".

There may be some special cases for very small values of abs(Xdiff(n)).

If PCM compression is used, i.e. abs(Xdiff(n))>the last b(i), Xdiff(n) is not used to compress that data value. Instead, that data value is compressed as Xorig(n)/s(m+1). Typically the format for a PCM value is "1xxxxxxx" where the number of "x" bits is equal to the number of "c" plus "x" bits when in DPCM mode. Note that there is no sign bit because Xorig(n)/s(m+1) is signed. Typically, the s( ) array contains only powers of 2 so that the divides are in fact right shifts.

Figure 2:
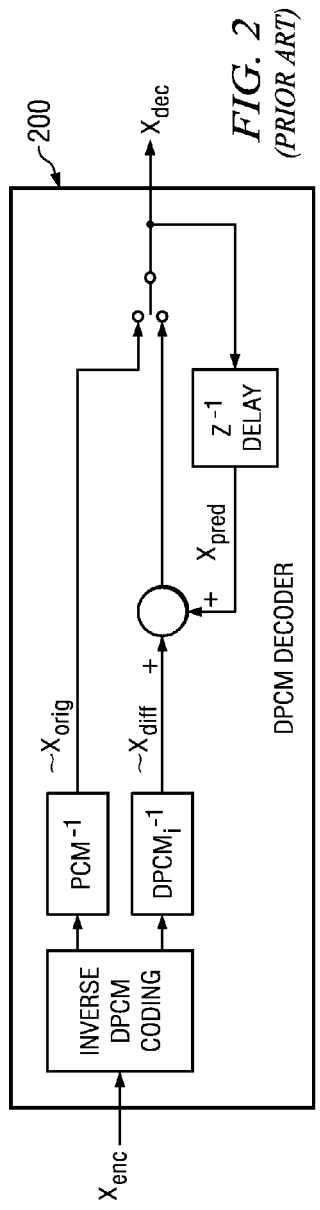
FIG. 2 is a block diagram of a prior art DPCM decoder.

FIG. 2 is a block diagram of a prior art DPCM decoder 200. In fact, the decompression algorithm is part of the compression algorithm because Xdec(n−1) is used during the compression process, as illustrated at 110 in FIG. 1. This means that the predicted value used in the compression algorithm is the same one that is used during decompression so that the decompression and compression algorithms reference the same predicted value. The decompression algorithm is well known and does not need to be described in detail herein. Suffice it to say that the decompression is the reverse of the compression algorithm with some additional offsets added to 'average' out the error introduced by the division by the s(i) values.

Referring again to Table 3, in general, DPCMn-m will represent compression when n>m and will represent decompression when n<m. Consider that a DPCM compressed stream of data values is available, for example, DPCM10-6. Assuming that the hardware can not directly decompress this compressed stream, it must be either decompressed in software or it must be transcoded to utilize hardware that is available. Software decompression is problematic because of the time involved to execute such an algorithm. In an exemplary embodiment of the invention, DPCM decompression hardware is available but it does not match the DPCM compression method. For example, assume that only DPCM8-12 is supported in hardware. The problem then is how to convert the DPCM10-6 output into an equivalent DPCM12-8 output that the DPCM8-12 hardware can decompress. Additionally, this conversion, or transcoding, must be performed very quickly such that it is significantly faster than a software DPCM decompression implementation for it to be useful. For this specific example, the transcoder is referred to as "Transcode6-8" or in the general case, "Transcode(n−m)."

Assumption and Guidelines

The solution requires a few assumptions and guidelines. It is assumed that some amount of data degradation is acceptable. Whether the data degradation is acceptable is totally qualitative and must be evaluated on a case-by-case basis. The solution is actually a software transcoding solution but must be significantly simpler than the software decompression solution that was ruled out earlier.

There are four scenarios that may be considered, using the above example as the reference.

1. Original

Xorig( )

2. DPCM12-8 only, which does not use DPCM10-6 in any way. After the decompression, this is the data set that would have been generated if the hardware supported the compression format.

Xorig( )→DPCM12-8→DPCM8-12

3. DPCM10-6 compression and decompression followed by DPCM12-8 compression and decompression. This represents what would have been generated with a software DPCM6-10 decompression.

Xorig( )→PCM10-6→DPCM6-10→DPCM12-8→DPCM8-12

4. DPCM10-6 then transcoded from 6 to 8 bits and the DPCM8-12 decompression. This represents what would have been generated with the transcoding solution.

Xorig( )→PCM10-6→Transcode6-8→DPCM8-12

These four scenarios produce data results that may differ in accuracy. When analyzing the data degradation in #4, which is an embodiment of the present invention, comparing it to #1 indicates the total data degradation from the original, but comparing it to #3 indicates the data degradation from the only other alternative, since the original data is never actually available.

The Transcode6-8 algorithm must generate a data set that can be properly decompressed by the DPCM8-12 hardware. Differences between it and the DPCM12-8 data set (#2 above) that would have been generated from the original data set is another measure of inaccuracy.

The b(m) value for the transcoder input for the DPCM compression at the transcoder input (DPCM10-6 in this example) must be less than or equal to the b(m) value for the DPCM compression at the transcoder output (DPCM12-8 in this example). This is based on the fact that any data value that is DPCM10-6 compressed in DPCM mode must also be DPCM12-8 compressed in DPCM mode, i.e. using the abs (Xdiff(n)), since either abs(Xdiff(n)) or Xorig(n) is used for any data element but not both. If this is not true, additional scaling is needed as described below.

In one embodiment of the invention, a solution is to generate a look-up table where the index into the table is the DPCM compressed value before transcoding (DPCMin). The table value at that index is the DPCM compressed value after transcoding (DPCMout). In the example above, DPCMin refers to DPCM10-6 format and DPCMout refers to DPCM12-8 format.

The table is generated to comprehend the fact that the index may represent a DPCM value or a PCM value. For a DPCM value, the corresponding transcoded DPCM value needs to be computed by decomposing it into the corresponding "c", "s" and "x" bits. Using the DPCMin algorithm definition, compute abs(Xdiff) using the DPCMin decompression equation for the DPCM mode. Note that this will not exactly match the original Xdiff due to truncation from the divide by s(i) but the decompression equation adds an offset to make the average error zero. Use the computed abs(Xdiff) and the sign value ("s" bit) to generate the DPCMout value. This is the data entered in table[index].

For a PCM value, the scaled value must be extracted from the index value and scaled and offset as defined in the DPCMin decompression equation. This yields a reconstructed Xorig(n) with error from the original data value. Use the computed Xorig(n) to generate the new PCM value.

Consider whether the last b( ) value in the DPCMin algorithm is (less than, equal to or greater than) the last b( ) value in the DPCMout algorithm. If equal, then any value that is PCM encoded when transcoding would also have been PCM encoded if the original image had been directly DPCM12-8 encoded. If less than, then there are some values that the transcoder PCM encodes that would not have been PCM encoded if the original image had been directly DPCM12-8 encoded. This is still compatible with the DPCM8-12 decoder. If greater than, then there are some values that need to be DPCM encoded but the Xdiff value is not available. This can be compensated by scaling all values in increments of 2, i.e. 0.5×, 0.25×, . . . until b(m) for DPCMin is less than or equal to b(m) for DPCMout. This scaling must then be removed in the image processing at some point.

FIG. 3 is a block diagram illustrating transcoding via a lookup table 300. Table 300 is used to convert the DPCMin values (index) into DPCMout values and is constructed as described above. In other words, for each data value except the first one in the DPCM sequence which is not predicted, DPCMout=table[DPCMin]. The first data value in each DPCM sequence must simply be rescaled properly per the DPCMin and DPCMout equations for the first data value. This should be a bit shift, at most.

In the embodiment of FIG. 3, the transcoding process utilizes a table 300 containing $2^n$ elements, where n is the number of bits the data stream is compressed to, i.e. in DPCM10-6, n=6. The table elements contain the DPCM representation in the new DPCM format. The index into the table is the data element in the original DPCM format. The table element at that index is the data element in the new DPCM format.

This simple look-up table approach results in a data stream in the new DPCM format which when decompressed, is supposed to 'closely' match the original data stream. Except in rare situations where the two DPCM formats are very closely matched, there will be some error between the data streams generated when the original DPCM data stream and the new DPCM data stream are decompressed. This error is manifested due to a mismatch between the decompressed value in the original DPCM format and the decompressed value in the new DPCM format. Since the decompressed value is used as the predicted value for decompressing the next data value, the error carries forward and can grow as decompression of subsequent data values contribute to the error.

In the case of image data where each line is DPCM compressed, this error may be visible as line artifacts as the error grows. The error will be reset (error=0) whenever a very sharp edge results in a data value being PCM encoded. In the case of audio data, the gradual growth of the error may not be noticeable as it results in a slight DC bias in the decompressed data values. When the error is reset (error=0) whenever a very sharp edge results in a data value being PCM encoded, the sudden correction of the error may be audible as a pop or click in the audio output. Unless the error grows significantly, it is more likely that the error will be audible more as a distortion rather than as a pop or click.

Note that DPCM transcoding without error correction is a quick and efficient method of transcoding the data. It is open-loop in that there is no feedback with each data value being transcoded independent from all other data values. The error is not bounded but is automatically reset whenever a PCM compressed data value is encountered. For low cost applications, the use of this embodiment of the invention may be sufficient.

DPCM Transcoding with Error Correction

For applications in which error introduced by the simple transcoding of FIG. 3 is not acceptable, error correction may be incorporated in another embodiment of the invention. This can be done since anytime a data value is transcoded from the input DPCM format to the output DPCM format, the residual error from transcoding the previous data value is known. This residual error may be used to adjust the transcoding of the current data value. The new residual error is easily determined and is used to adjust the transcoding of the next data value.

FIG. 4 is a block diagram illustrating error correction during a transcoding process. The first data value in the input data stream 402 is not predicted, it is merely scaled to fit in the available bits, i.e. the DPCM10-6 or DPCM12-8 algorithm simply divides this data value by 16. At the same time, the residual error is set to zero, as indicated at 404.

The DPCM value for the second data value is decomposed 410 into the DPCM mode, sign and value. The value is the absolute value of the difference between the predicted value and the original value, computed using the decompression algorithm for the original DPCM format. There is some quantization in this computed difference due to a division in the compression algorithm. It is a linear function of the data bits in the DPCM data. (value=abs(Xdiff)). The sign is the sign of Xdiff. DPCM mode indicates which equation was used to generate the value. There will be a number of DPCM modes for progressively increasing magnitudes of value, as was indicated in Table 2. If a value is too large to be represented based on Xdiff, the data value is PCM compressed 412 as a scaled version of the original data value (Xorig). Any data value that is PCM compressed in the original DPCM format must also be PCM compressed in the new DPCM format because the only data available is a function of Xorig. Similarly, any data value that is DPCM compressed in the original DPCM format must also be DPCM compressed in the new DPCM format because the only data available is a function of Xdiff.

If the residual error 406 is zero, then the value from above is the same value that is to be compressed in the new DPCM format. In the case of the second data value, this residual error is zero. For subsequent data values the residual error may not be zero. All data values after the first one are processed in the same way, so a non-zero residual error may be considered for explanation purposes. The following applies to DPCM compressed data values (not PCM compressed). Referring again to FIG. 4, the residual error 406 (from an immediately previous data value) is subtracted 420 from the computed signed Xdiff. This now represents the difference (with quantization) between the original data value and the predicted value with any residual error removed, referred to as the signed adjusted value 422. The sign and magnitude of the signed adjusted value now must be determined 430. The magnitude is used to generate 430 the compressed data value in the new DPCM format using the compression algorithm of the new DPCM format. The magnitude defines the DPCM mode in the new DPCM format. The DPCM mode, sign and compressed data value are then coded 440 into the new DPCM data value 442. When the compressed data value in the new DPCM format is computed, there is residual error 432 due to round-off. This residual error is removed during transcoding of the next data value.

When a PCM compressed data value is encountered, the residual error from the previous data value is discarded. The PCM compressed data value which is a function of the original data value, is scaled as required for the new DPCM format. In the case of DPCM10-6 being transcoded to DPCM12-8, the PCM compression is identical because in both cases, the data width is being reduced by 4 bits. There is no residual error when transcoding PCM compressed data values when this is true. If the amount of data width reduction is not the same, then there could be residual error 434 from transcoding PCM compressed data values. For example, when transcoding from DPCM10-7 to DPCM12-8, an additional bit is lost in the transcoding process. The residual error 436 to be used in transcoding the next data value in this case will therefore be −1, 0 or +1.

Implementation of DPCM Transcoding with Error Correction

The sequence described with respect to FIG. 4 requires decomposition of the original DPCM data value into the mode, sign and value components. The residual error is then removed and the new DPCM data value is generated. There are a considerable number of computations and data manipulations. However, notice that for each original DPCM data value and residual error combination, the new DPCM data value and new residual error can be pre-computed. This can be observed by noting that the original DPCM data value 402 and the residual error 406 are the only inputs in the block diagram of FIG. 4 and there are no stored states inside the block diagram.

Figure 5:
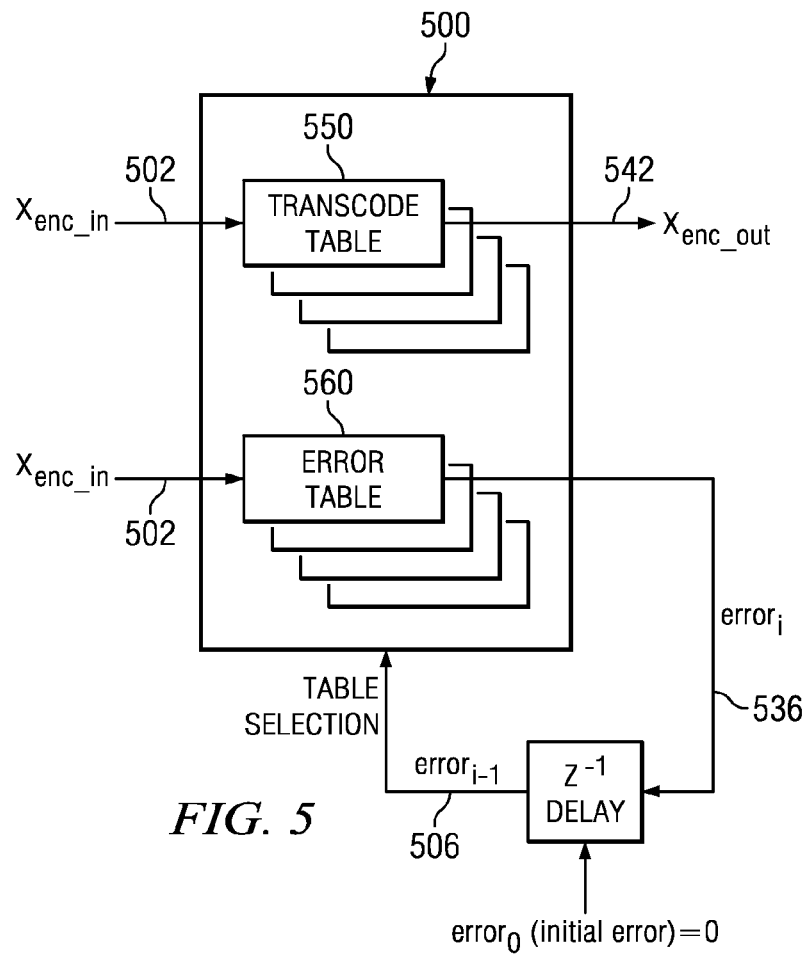
FIG. 5 is a block diagram illustrating transcoding via a lookup table with error correction.

FIG. 5 is a block diagram illustrating transcoding via a lookup table 500 with error correction. Once the residual error 506 is known, let that residual error select a look-up table 550 of new DPCM data values and a look-up table 560 of new residual error values. The selected look-up tables are then indexed by the original DPCM data value 502 and the outputs of the look-up tables are the new DPCM data value 542 and the new residual error 536.

Figure 6:
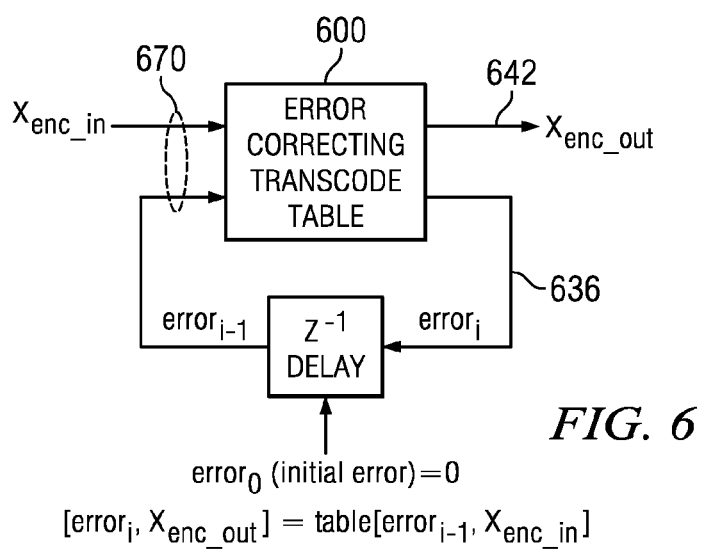
FIG. 6 is a block diagram illustrating a simplified transcoding lookup table with error correction.

FIG. 6 is a block diagram illustrating a simplified transcoding lookup table 600 with error correction. Instead of having separate DPCM data value tables and residual error value tables, both are combined into a single table. Instead of each table containing only DPCM data values, each table element must be larger than before to accommodate both the new DPCM data value 642 and residual error 636. Additionally, instead of letting the previous residual error select the table and using the original DPCM data value as the index, the previous residual error is concatenated 670 to the original DPCM data value. This then becomes the index into a single table.

System Example

Figure 7:
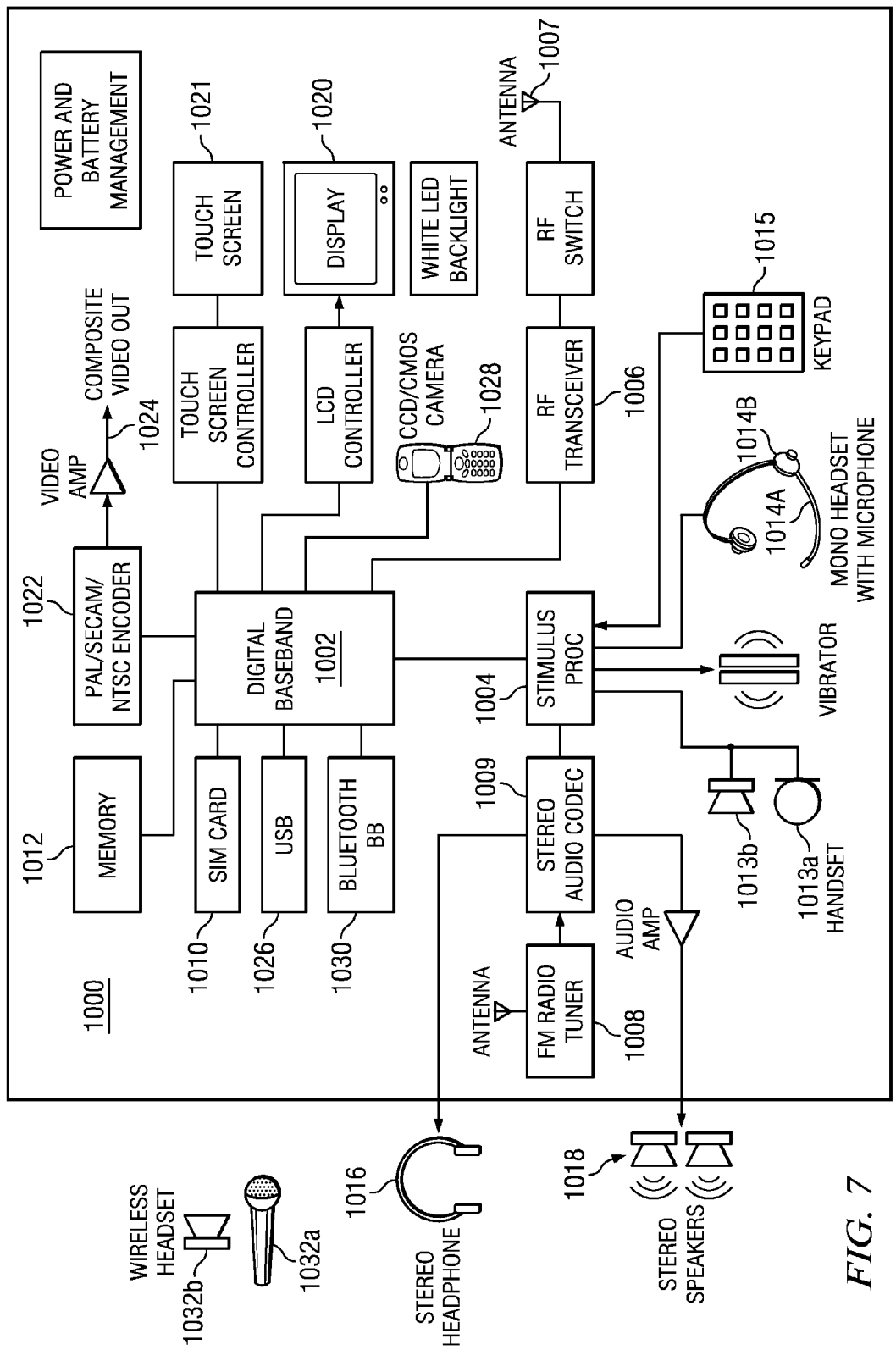
FIG. 7 is a block diagram of an exemplary cell phone that performs transcoding.

FIG. 7 is a block diagram of mobile cellular phone 1000. Digital baseband (DBB) unit 1002 may include a digital processing processor system (DSP) that includes embedded memory and security features. Stimulus Processing (SP) unit 1004 receives a voice data stream from handset microphone 1013*a* and sends a voice data stream to handset mono speaker 1013*b*. SP unit 1004 also receives a voice data stream from microphone 1014*a* and sends a voice data stream to mono headset 1014*b*. Usually, SP and DBB are separate ICs. In most embodiments, SP does not embed a programmable processor core, but performs processing based on configuration of audio paths, filters, gains, etc being setup by software running on the DBB. In an alternate embodiment, SP processing is performed on the same processor that performs DBB processing. In another embodiment, a separate DSP or other type of processor performs SP processing.

RF transceiver 1006 is a digital radio processor and includes a receiver for receiving a stream of coded data frames from a cellular base station via antenna 1007 and a transmitter for transmitting a stream of coded data frames to the cellular base station via antenna 1007. RF transceiver 1006 is coupled to DBB 1002 which provides processing of the frames of encoded data being received and transmitted by cell phone 1000.

DBB unit 1002 may send or receive data to various devices connected to universal serial bus (USB) port 1026. DBB 1002 can be connected to subscriber identity module (SIM) card 1010 and stores and retrieves information used for making calls via the cellular system. DBB 1002 can also be connected to memory 1012 that augments the onboard memory and is used for various processing needs. DBB 1002 can be connected to Bluetooth baseband unit 1030 for wireless connection to a microphone 1032*a* and headset 1032*b* for sending and receiving voice data. DBB 1002 can also be connected to display 1020 and can send information to it for interaction with a user of the mobile UE 1000 during a call process. Display 1020 may also display pictures received from the network, from a local camera 1028, or from other sources such as USB 1026. DBB 1002 may also send a video stream to display 1020 that is received from various sources such as the cellular network via RF transceiver 1006 or camera 1028. DBB 1002 may also send a video stream to an external video display unit via encoder 1022 over composite output terminal 1024. Encoder unit 1022 can provide encoding according to PAL/SECAM/NTSC video standards. In some embodiments, audio codec 1009 receives an audio stream from FM Radio tuner 1008 and sends an audio stream to stereo headset 1016 and/or stereo speakers 1018. In other embodiments, there may be other sources of an audio stream, such a compact disc (CD) player, a solid state memory module, etc.

Camera 1028 includes compression circuitry similar to module 100 of FIG. 1 that compresses picture information obtained from its image array using a DPCM10-6 compression format to form a data stream that is sent to DBB 1002 for processing. While this exemplary cell phone includes a camera that produces DPCM10-6 compression, it is to be understood that other embodiments of the invention may include a camera that produces another format of compression, as discussed above. Compressed picture data from the camera may be transferred to SIM card 1012 or to other memory within cell phone 1000 for later access and processing.

DBB 1002 includes a hardware assisted decompression module that is configured to process the data stream from the camera. However, the hardware assisted decompression module is configured to perform DPCM8-12 decompression. This module is similar to module 200 described with respect to FIG. 2. In order to use the hardware assisted decompression module, DBB 1002 performs software based transcoding as described above with reference to FIGS. 3-6.

Instructions stored in memory 1012 are executed by a processor within DBB 1002 to perform the operation of receiving a stream of compressed data samples from the camera that has the DPCM10-6 compression format. This data may be obtained directly from the camera or stored picture data may be retrieved from SIM card 1010 or other local memory. A transcoding table that is configured as described with regard to FIG. 3 is pre-stored in memory 1012. The transcoding table is accessed by using each of a portion of received data samples as an index into the table to form a set of transcoded data samples having the DPCM12-8 compression format. The transcoded portion of the data stream replaces the original DPCM10-6 samples to form a stream of compressed data samples having the DPCM12-8 compression format. The DPCM12-8 formatted data samples are then decompressed by the hardware based decoder within DBB 1002.

In another embodiment, the transcoding table in memory 1012 is constructed as described with respect to FIG. 6. In this embodiment, transcoding with error correction is performed by a program executed within DBB 1002 as described with regard to FIGS. 4-6. Each entry contains an error portion that is used for error correction by concatenating it with the next data sample to form an index that is used to access the table.

OTHER EMBODIMENTS

The embodiments of the invention described above assume that all data elements are coded to the same number of bits. However, in an embodiment in which an adaptable number of bits are used, then a set of transcoding tables may be created that are selected based on the current number of bits being used in each sample, while carrying any residual error forward for error correction, if error correction is used.

The techniques described in this disclosure may be implemented in hardware, software, firmware, or any combination thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a computer-readable medium such as compact disc (CD), a diskette, a tape, a file, memory, or any other computer readable storage device and loaded and executed in the processor. In some cases, the software may also be sold in a computer program product, which includes the computer-readable medium and packaging materials for the computer-readable medium. In some cases, the software instructions may be distributed via removable computer readable media (e.g., floppy disk, optical disk, flash memory, USB key), via a transmission path from computer readable media on another digital system, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

It is therefore contemplated that the appended claims will cover any such modifications of the embodiments as fall within the true scope and spirit of the invention.

What is claimed is:

1. A method for converting compressed data, the method comprising:

receiving a stream of compressed data samples having a first compression format, wherein each data sample represents one of n values corresponding to the first compression format;

accessing a transcoding table having at least n indexed entries, wherein each of the n indexed entries contains a data value corresponding to a second compression format, wherein the transcoding table is accessed by using each of a portion of received compressed data samples as an index into the table to form a set of transcoded data samples having the second compression format; and replacing the portion of data samples in the stream of compressed data with the set of transcoded data samples to form a stream of compressed data samples having the second compression format, wherein an error in a transcoded data sample is represented by a error value having r bits, wherein the transcoding table contains at least n x r indexed entries, wherein each indexed entry contains a data value corresponding to the second compression format and an associated error value; and wherein the transcoding table is accessed with an index value formed by concatenating a data sample having the first compression format with an error value from a preceding transcoding table access.

2. The method of claim 1, further comprising decompressing the stream of data samples having the second compression format.

3. The method of claim 1, further comprising decompressing the stream of data samples having the second compression format.

4. A method for converting compressed data, the method comprising:

forming a transcoding table by:

determining a sample value in a second compression format for each possible sample value in a first compression format; and arranging the determined second compression format sample values to form the transcoding table indexed by the first compression format sample value, wherein forming the trancoding table further comprises:
determining an error value for each determined second compression format value;
wherein determining a sample value in a second compression format for each possible sample value in a first compression format further comprises determining a sample value in the second compression format corresponding to each error value; and
wherein the transcoding table is formed by arranging the determined second compression format sample values to form the transcoding table indexed by the first compression format sample value concatenated with an error value.

5. The method of claim 4, further comprising:
receiving a stream of compressed data samples having the first compression format, wherein each data sample represents one of n values corresponding to the first compression format;
accessing the transcoding table by using each of a portion of data samples as an index into the table to form a set of transcoded data samples having a second compression format; and
replacing the portion of data samples in the stream of compressed data with the set of transcoded data samples to form a stream of compressed data samples having the second compression format.

6. The method of claim 5, further comprising decompressing the stream of data samples having the second compression format.

7. The method of claim 4, wherein each entry of the transcoder table includes an error value for the associated second compression format sample value.

8. The method of claim 7, wherein an error in a transcoded data sample is represented by a error value having r bits, wherein the transcoding table contains at least n x r indexed entries, wherein each indexed entry contains a data value corresponding to the second compression format and an associated error value; and
wherein the transcoding table is accessed with an index value formed by concatenating a data sample having the first compression format with an error value from a preceding transcoding table access.

9. The method of claim 7 further comprising:
receiving a stream of compressed data samples having a first compression format, wherein each data sample represents one of n values corresponding to the first compression format;
accessing the transcoding table by using each of a portion of data samples as an index into the table to form a set of transcoded data samples having a second compression format, wherein the transcoding table is accessed with an index value formed by concatenating a data sample having the first compression format with an error value from a preceding transcoding table access; and
replacing the portion of data samples in the stream of compressed data with the set of transcoded data samples to form a stream of compressed data samples having the second compression format.

10. The method of claim 8, further comprising decompressing the stream of data samples having the second compression format.

11. A digital system comprising:
receiving circuitry for receiving a stream of compressed data samples having a first compression format, wherein each data sample represents one of n values corresponding to the first compression format;
a transcoder table stored in a memory circuit, the transcoder table having at least n indexed entries, wherein each of the n indexed entries contains a data value corresponding to a second compression format, wherein the transcoding table is configured to be accessed by using each of a portion of received data samples as an index into the table to form a set of transcoded data samples having a second compression format;
access circuitry coupled to the transcoder table, the access circuitry operable to replace the portion of data samples in the stream of compressed data with the set of transcoded data samples to form a stream of compressed data samples having the second compression format,
wherein an error in a transcoded data sample is represented by a error value having r bits, wherein the transcoding table contains at least n x r indexed entries, wherein each indexed entry contains a data value corresponding to the second compression format and an associated error value; and
wherein the transcoding table is configured to be accessed with an index value formed by concatenating a data sample having the first compression format with an error value from a preceding transcoding table access.

12. The digital system of 11, further comprising a digital camera coupled to the receiving circuitry, the digital camera operable to produce the stream of compressed data samples having the first compression format.

13. The digital system of claim 12, further comprising processing circuitry coupled to the accessing circuitry, the processing circuitry operable to decode a stream of compressed data samples having the second compression format.

14. The digital system of claim 13 being a cellular telephone.

* * * * *